United States Patent [19]

Hazaki et al.

[11] Patent Number: 5,026,995
[45] Date of Patent: Jun. 25, 1991

[54] PARTICLE BEAM SURFACE ANALYZER

[75] Inventors: Eiichi Hazaki, Tsuchiura; Tadashi Otaka; Minoru Shimizu, both of Katsuta, all of Japan

[73] Assignee: Hitachi, Ltd., Tokyo, Japan

[21] Appl. No.: 539,810

[22] Filed: Jun. 18, 1990

[30] Foreign Application Priority Data

Jun. 19, 1989 [JP] Japan .................................. 1-156446

[51] Int. Cl.⁵ .............................................. H01J 37/18
[52] U.S. Cl. .................................. 250/441.1; 250/440.1; 250/442.1
[58] Field of Search ............... 250/441.1, 440.1, 442.1, 250/310, 311, 306, 309

[56] References Cited

U.S. PATENT DOCUMENTS 2,508,317  5/1950  Verhoeff ........................ 250/441.1
4,020,353  4/1977  Saito et al. ..................... 250/441.1
4,066,905  1/1978  Dassler et al. .................. 250/441.1

Primary Examiner—Jack I. Berman
Assistant Examiner—Kiet T. Nguyen
Attorney, Agent, or Firm—Antonelli, Terry, Stout & Kraus

[57] ABSTRACT

In a particle beam surface analyzer, having a partition wall separation a vacuum space, an opening that is provided in a partition wall through which the particle beam is taken out, a seal member which is moved along a seal surface of the seal member and seals the opening, a condenser lens which converges the particle beam onto the sample, and detector for detecting a physical quantity from the sample when the particle beam is irradiated on the sample, the surface analyzer further has a movable shift member that pushes one side surface of the seal member along the seal surface of the seal member and a stopping member which the other side surface of the seal member having a predetermined angle being larger than 55° and smaller than 75° to the seal surface is abutted so as to move the seal member along the other side surface till the seal member reaches the openings, whereby resultant forces between the seal member and the seal surface in the side of the one side surface is equal to that in the side of the other side surface. As the predetermined angle is larger than 55° and smaller than 75° to the seal surface, the abrasion and seizure of the seal member are prevented and the contamination of the sample is lessened.

12 Claims, 4 Drawing Sheets

PARTICLE BEAM SURFACE ANALYZER

BACKGROUND OF THE INVENTION

The present invention relates to a surface analyzer for analyzing a surface of material using a particle beam such as an electron microscope, an ion microanalyzer etc..

As disclosed in the official gazette of Japanese Patent Laid-Open No. 49-132976 (1974), a prior-art surface analyzer using a particle beam has been such that, in order to hermetically seal an opening by the use of a valve, through which the particle beam passes, a seal member is formed with front and rear slant surfaces in the shifting direction thereof, whereupon thrusts in the shifting direction are exerted on the slant surfaces from pins mounted on a stopping member and a shift member, so as to endow the seal member with a pressing force toward the opening.

In the prior art mentioned above, a frictional distance between the seal member and the seal surface of the opening becomes so long that the abrasion and seizure of the seal member such as a sealing 0-ring are produced. Especially in a scanning electron microscope for measuring the pattern line width of a semiconductor wafer, abraded powder which appears in a gate valve falls on the surface of the wafer to degrade the available percentage of the wafer. A further problem is that, in the microscope of this type requiring a high throughput, the gate valve seizes up in a short term to render the analysis impossible.

SUMMARY OF THE INVENTION

The present invention has been made in view of the above drawbacks, and its object is to provide a surface analyzer employing a particle beam, which prevents the abrasion and seizure of a gate valve, which lessens the contamination of a sample and which renders an analysis of long term possible.

The object is accomplished by substantially equalizing resultant forces between component forces perpendicular to a seal surface of an opening, of normal forces based on thrusts in a shifting direction of a seal member, and component forces perpendicular to said seal surface of said opening, of tangential forces based on frictional forces, said thrusts and said frictional forces acting on contact parts between said seal member and a shift member and between said seal member and a stopping member, and at this time, after the seal member abutted to the stopping member, the seal member approaches to the seal surface of the opening with an angle of more than 55° by a guide action of a slant surface of the contact part in the side of the stopping member.

Owing to the above expedient, the seal surface of the seal member including a sealing 0-ring moves in the shifting direction of the seal member while approaching the seal surface of the opening in parallel therewith, thereby to be pressed on the seal surface of the opening. Thus, the seal surface of the seal member is pressed against the seal surface of the opening under a uniform surface pressure without the long frictional distance, whereby the abrasion and seizure of a gate valve are prevented, the contamination of a sample is lessened, and an analysis of long term becomes possible.

Detailed Description of the Preferred Embodiments

Figure 1:
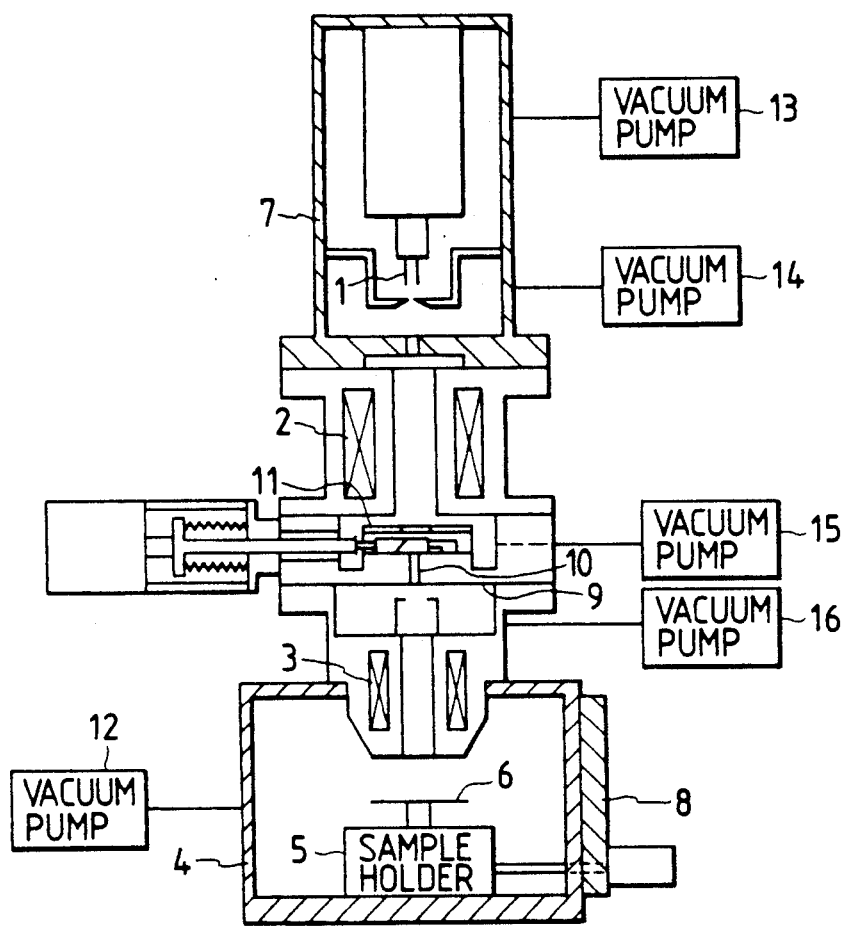
FIG. 1 is a vertical sectional view of one embodiment of a surface analyzer employing a particle beam according to the present invention.

Now, the present invention will be described in conjunction with illustrated embodiments. One embodiment of the present invention is shown in FIGS. 1 to 5. FIG. 1 shows a scanning electron microscope for measuring the minute line width of a wafer. As shown in the figure, the electron microscope analyzes the configuration of a wafer surface in such a way that an electron beam generated by an electron gun 1 is projected through a condenser lens 2 as well as an objective lens 3 onto a wafer 6 being a sample which is placed on a sample holder 5 within a sample chamber 4, and that secondary electrons which are emitted from the wafer 6 are detected. In view of the consumption of the electron gun 1, etc., an electron gun chamber 7 needs to be held in an ultra-high vacuum. When the wafer 6 is to be exchanged, a lid 8 is opened. On this occasion, the sample chamber 4 is arranged to be open to the atmospheric air. Since the sample chamber 4 and the electron gun chamber 7 are connected, the electron gun chamber 7 is also arranged to be open to the atmospheric air without any contrivance, and a long time is expended in subsequently attaining the ultra-high vacuum. In order to prevent this drawback, a partition wall 9 which divides the electron gun chamber 7 and the sample chamber 4 is provided, and it is formed with a opening 10 through which the electron beam passes during the analysis of the sample, whereby when the sample chamber 4 is let open to the atmospheric air, the opening 10 is closed with a gate valve 11 so as to hold the electron gun chamber 7 in the ultra-high vacuum. In the figure, numerals 12–16 designate vacuum pumps which evacuate the sample chamber 4, the electron gun chamber 7, etc..

Figure 2:
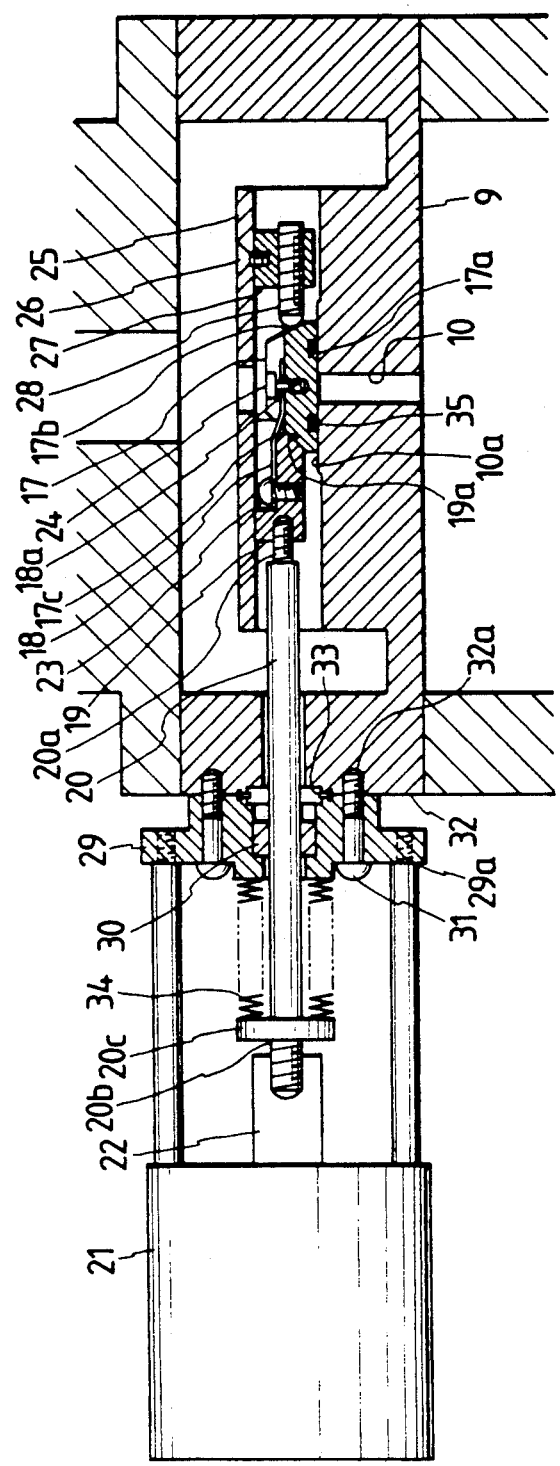
FIGS. 2 and 3 are vertical sectional views of a gate valve in one embodiment of the present invention.

Shown in FIG. 2 are the details of the gate valve 11 in FIG. 1. A seal member such as seal valve 17 is coupled to a shift member such as a push metal 19 through a leaf spring 18. The push metal piece 19 is joined with a threaded portion 20a at one end of a drive shaft 20, the other end of which is joined to the rod 22 of an air cylinder 21 by a threaded portion 20b, whereby the push metal piece 19 is shifted in the axial direction of the drive shaft 20 by an axial thrust which is generated by the air cylinder 21. One end of the leaf spring 18 is fixed to the push metal piece 19 by a screw 23, and the seal valve 17 is mounted on the other end of the leaf spring 18 by a screw 24 so as to be movable in the axial direction of the drive shaft 20 through a long slot 18a of this leaf spring. The seal valve 17 is stopped its movement in the axial direction of the drive shaft 20 by a stopping member such as a stopper 28 which is received by a stopper receiver 27 fixed to a valve receptacle 25 by a screw 26. The drive shaft 20 is guided by a bearing 30 which is fitted in a seal block 29. The air cylinder 21 is fixed to the seal block 29, which is fixed by screws 31 to a gun cylinder portion 32 being unitary with the partition wall 9. The gun cylinder portion 32 and the seal block 29 are sealed by interposing a metal gasket 33 between edge portions 32a and 29a respectively provided. One end of a bellows 34 is welded to the disc portion 20c of the drive shaft 20, while the other end of the bellows 34 is welded to the seal block 29.

As to the surface analyzer thus constructed, FIG. 2 shows the positional relationship of the gate valve 11 in the case of replacing the sample 6 in FIG. 1. The seal valve 17 is pressed against the convex seal surface 10a of the opening 10, and the sample chamber 4 and the electron gun chamber 7 are sealed by an 0-ring 35 fitted in the seal surface 17a of the seal valve 17, so that the electron gun chamber 7 is kept in the ultra-high vacuum even when the sample chamber 4 is arranged to be open to the atmospheric air. When the sample 6 is to be analyzed, the sample chamber 4, etc. are first evacuated by the vacuum pump 12, etc. in the state of FIG. 1.

Figure 3:
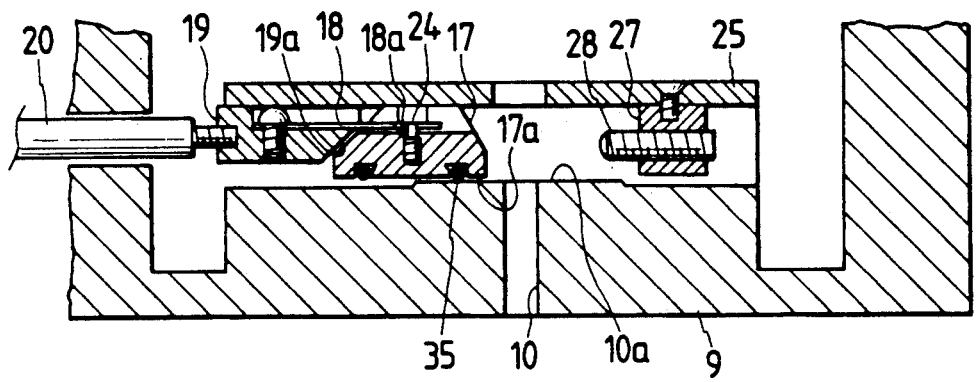

Subsequently, the air cylinder 21 is actuated in the state of FIG. 2, wherein the seal valve 17 is moved leftwards as viewed in the figure into the state of FIG. 3. Thus, the sample is irradiated with the electron beam through the opening 10 of the partition wall 9 and is analyzed. In the state of FIG. 3, the seal valve 17 is released from the pressing force thereof against the seal surface 10a of the opening 10, and the leaf spring 18 returns into its original state, so that the seal surface 17a of the seal valve 17 comes away from the seal surface 10a of the opening. In addition, when the seal valve 17 is moved leftwards as viewed in the figure, the leaf spring 18 is first moved leftwards together with the push metal piece 19 owing to the frictional force between the 0-ring 35 and the seal surface 10a of the opening 10 until the screw 24 mounted on the seal valve 17 abuts against the right end of the slot 18a of the leaf spring 18. Thereafter, the seal valve 17 is drawn leftwards as viewed in the figure, consequently, the push metal piece 19 and the seal valve 17 fall into a slightly spaced state. When the sample is to be exchanged, the seal valve 17 is shifted rightwards as viewed in the figure by the air cylinder, thereby to establish the state of FIG. 2. That is, the drive shaft 20 and the push metal piece 19 are moved rightwards in FIG. 3 until the slant surface 17b of the seal valve 17 abuts against the stopper 28 having a hemispherical fore end, as shown in FIG. 2.

As illustrated in FIG. 2, when the slant surface 17b of the seal valve 17 has abutted against the stopper 28, the slot 18a of the leaf spring 18 is guided by the screw 24 to move rightwards as viewed in the figure, and the slant surface 17c of the seal valve 17 opposite to the slant surface 17b thereof abutting against the stopper 28 comes into contact with the slant surface 19a of the push metal piece 19. The position and length of the slot 18a are set so that, on this occasion, a clearance may exist between the left end of the slot 18a and the screw 24. Further, when a rightward axial thrust is given on the push metal piece 19 through the drive shaft 20 by the air cylinder 21, forces to press down the seal valve 17 are applied from the stopper 28 to the slant surface 17b of the seal valve 17 and simultaneously from the slant surface 19a of the push metal piece 19 to the slant surface 17c, so that the seal surface 17a of the seal opening 10. Thus, the 0-ring 35 fitted in the seal surface 17a of the seal valve 17 is pressed against the seal surface 10a of the opening 10, so that the opening 10 is sealed. Under this state, the sample chamber 4 is let open to the atmospheric air, and the sample is exchanged. On this occasion, the electron gun chamber 7 (refer to FIG. 1 as to both the chambers) is shut off from the atmospheric air by the 0-ring 35 of the seal valve 17, and the ultra-high vacuum thereof is held.

Figure 4:
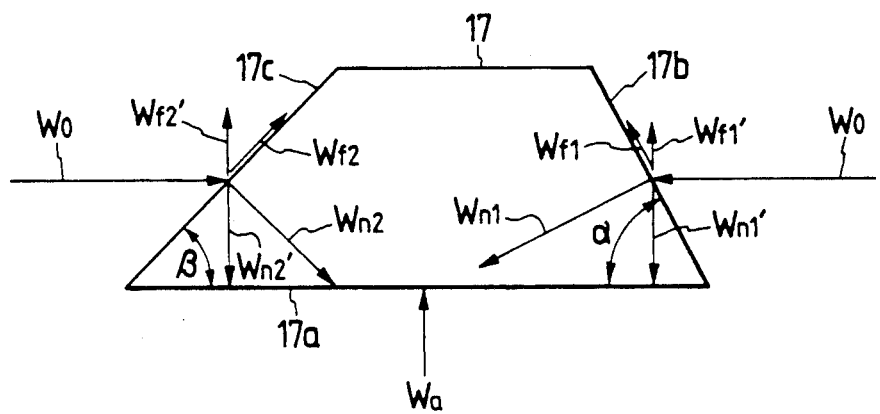
FIGS. 4 and 5 are explanatory views showing the pressing operation of the gate valve in one embodiment of the present invention.
Figure 5:
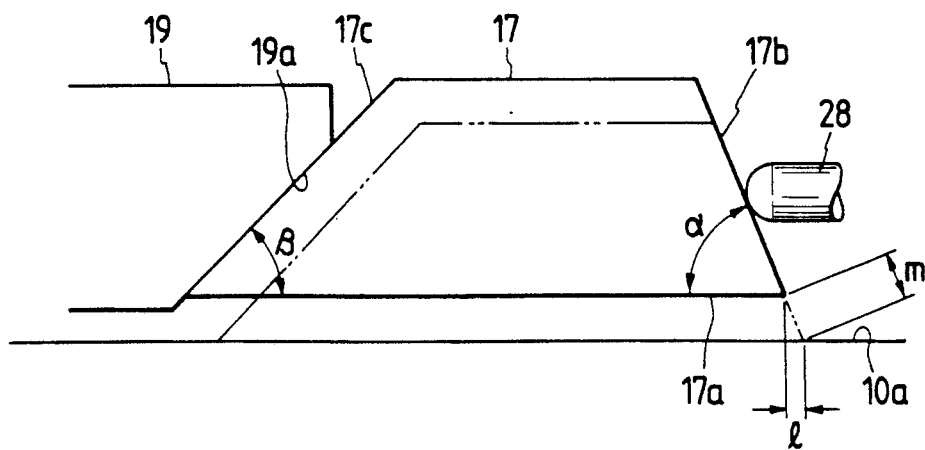

Regarding the surface analyzer thus constructed, as shown in FIGS. 4 and 5, the resultant forces $W_{n1}'-W_{f1}'$ and $W_{n2}'-W_{f2}'$ between the component forces $W_{n1}'$, $W_{n2}'$ perpendicular to the seal surface 10a of the opening, of normal forces $W_{n1}$, $W_{n2}$ based on thrusts in the shifting direction of the seal valve (axial thrusts), $W_O$ and the component forces $W_{f1}'$, $W_{f2}'$ perpendicular to the seal surface 10a of the opening, of tangential forces $W_{f1}$, $W_{f2}$ based on frictional forces are equalized each other, that is, $(W_{n1}'-W_{f1}')=(W_{n2}'-W_{f2}'')$, the thrusts and the frictional forces acting on the contact parts respectively between the seal valve 17 and the push metal piece 19 and between the seal valve 17 and the stopper 28. In this way, the seal surface 17a of the seal valve 17 including the sealing 0-ring moved in the shifting direction thereof while approaching the seal surface 10a of the opening 10 (refer to FIG. 3) in parallel therewith, and it is pressed against the seal surface 10a of the opening, consequently, the seal surface 17a of the seal valve 17 is pressed against the seal surface 10a of the opening under a uniform surface pressure without abutting ununiformly.

More specifically, the axial thrusts $W_O$ based on the air cylinder 21 act on the respective slant surfaces 17b and 17c of the seal valve 17 by the stopper 28 and the push metal piece 19. $W_{n1}$ and $W_{n2}$ are respectively let denote the normal forces exerted on the slant surfaces 17b and 17c of the seal valve 17 by the axial thrusts $W_O$, while $W_{n1}'$ and $W_{n2}'$ are respectively let denote the component forces of the normal forces $W_{n1}$ and $W_{n2}$ in the direction perpendicular to the seal surface 10a of the opening. The frictional forces $W_{f1}$ and $W_{f2}$ along the slant surfaces are respectively exerted on the slant surfaces 17b and 17c of the seal valve 17 from the stopper 28 and the push metal piece 19, and the component forces of the frictional forces $W_{f1}$ and $W_{f2}$ in the direction perpendicular to the seal surface 10a of the opening are respectively denoted by $W_{f1}'$ and $W_{f2}'$. A force $W_a$ perpendicular to the seal surface 10a of the opening acts on the seal surface 17a of the seal valve 17 through the 0-ring from the seal surface 10a of the opening. $\alpha$ and $\beta$ are respectively let denote angles which the slant surfaces 17b and 17c of the seal valve 17 respectively define with respect to the seal surface 17a of the seal valve 17. In this embodiment, the respective angles $\alpha$ and $\beta$ of the slant surfaces 17b and 17c of the seal valve 17 are set at $\alpha > \beta$, so that a relationship of $W_{n1}' < W_{n2}'$ holds between the component forces $W_{n1}'$ and $W_{n2}'$ perpendicular to the seal surface 10a as based on the axial thrusts $W_O$. Besides, in this embodiment, the slant surface 17b of the seal valve 17 and the stopper 28 are brought into point contact by making the force end of the stopper 28 hemispherical, while the slant surface 17c and the push metal piece 19 are brought into surface contact owing to the slant surface 19a of the later.

The friction factor has an effect called the "surface pressure effect", which signifies that the friction factor decreases when the contact surface pressure between two objects contacting with each other increases. On the basis of this fact, the frictional force acting between the slant surface 17b of the seal valve 17 and the stopper 28 becomes smaller than the frictional force acting between the slant surface 17c and the push metal piece 19, and a relationship of $W_{f1}' < W_{f2}'$ arises in a sense opposite to that of the foregoing component forces based on the axial thrusts $W_O$, between the component forces $W_{f1}'$ and $W_{f2}'$ perpendicular to the seal surface $10a$ of the opening as based on the frictional forces. In this embodiment, $\alpha = 70°$ and $\beta = 45°$ are set, and the resultant forces $(W_{n1}'-W_{f1}')$ and $(W_{n2}'-W_{f2}')$ of the component forces perpendicular to the seal surface $10a$ of the opening are substantially equalized, the component forces being based on the axial thrusts and the frictional forces which act on the slant surfaces $17b$ and $17c$ of the seal valve 17.

Figure 7:
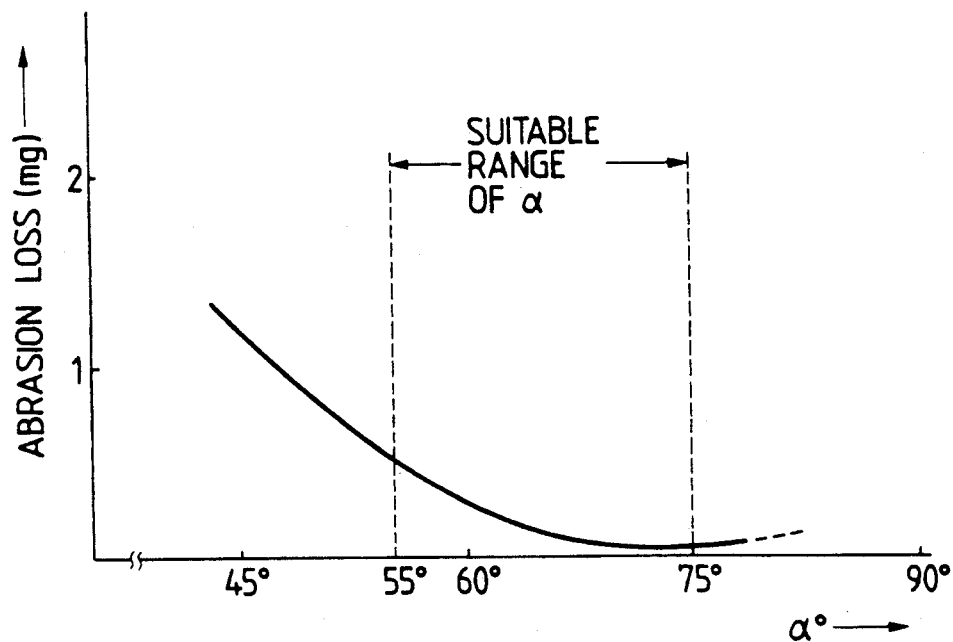

Concerning the angle $\alpha$ of the slant surface $17b$, we got an experimental valves shown in FIG. 7. When the seal valve 17 is moved to the right side by being pushed by the push material piece 19, the seal valve 17 is abutted to the stopper 28 so as to approach to the seal surface $10a$ of the opening by a guide action of the slant surface $17b$. After touching seal surface $10a$ the 0-ring of the seal valve moves to the right moreover so as to arise a frictional distance L.

The abrasion loss of the 0-ring is proportional to the frictional distance L, so, the frictional distance should be short so as to make the abrasion loss small. In our experiment, when the angle $\alpha$ of the slant surface was more than 55°, the abrasion loss of 0-ring was small. But when the angle $\alpha$ is more than 75°, the component forces $W_{n1}'$ and $W_{n2}'$ become small in comparison with the axial thrusts. Therefore, the suitable range of the angle $\alpha$ is more than 55° and is not more than 75°.

In this way, the seal surface $17a$ of the seal valve 17 moves while keeping parallelism to the seal surface $10a$ of the opening, since the touches of the seal valve 17 with the stopper 28 and the push metal piece 19 (solid lines in FIG. 5) until the seal surface $17a$ of the seal valve 17 is pressed against the seal surface $10a$ of the opening (two-dot chain lines in FIG. 5). Consequently, the seal surface $17a$ of the seal valve 17 and the seal surface $10a$ of the opening are pressed under a uniform contact surface pressure without abutting ununiformly, and the abrasion and seizure of the contact parts can be prevented. Moreover, since the 0-ring is pressed under a uniform contact surface pressure, it does not become dirty, and its abnormal abrasion can be prevented. As a result, the surface of the wafer set in the sample chamber of the surface analyzer is relieved from being contaminated with falling abraded powder, so that an available percentage in semiconductor production is enhanced, and the trouble of the gate valve in a short term can be prevented, so that the maintenance period of the surface analyzer can be greatly prolonged.

In addition, since the seal valve 17 is brought into point contact with the stopper 28 and into surface contact with the push metal piece 19, the ununiform abutment between the slant surface $17c$ of the seal valve 17 and the slant surface $19a$ of the push metal piece 19 can be prevented, and the abrasion and seizure of the contact parts can be prevented. Although this embodiment is constructed so as to bring the seal valve 17 and the stopper 28 into point contact, similar effects can be achieved even by bringing the seal valve 17 and the push metal piece 19 into point contact and bringing the seal valve 17 and the stopper 28 into surface contact. Besides, insofar as the pressing forces toward the opening are exerted on both the sides of the seal valve 17, the slant surfaces may well lie in any of the seal valve 17, stopper 28 and push metal piece 19.

In this manner, according to this embodiment, the seal surface of the seal valve of the gate valve of the surface analyzer using the particle beam can be pressed on the seal surface of the opening with the appropriate operation, to prevent the abrasion and seizure of the seal surface of the seal valve, as well as the 0-ring fittedly mounted on this surface, and the seal surface of the opening, so that the contamination of the sample in the surface analyzer can be prevented, and the reliability of the surface analyzer can be enhanced.

Figure 6:
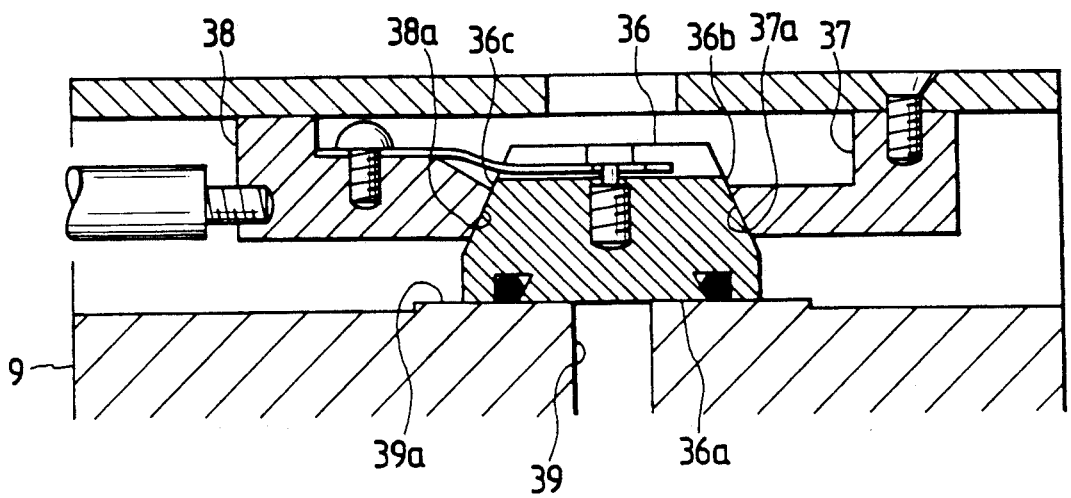
FIG. 6 is a vertical sectional view of a gate valve in another embodiment of the surface analyzer employing a particle beam according to the present invention.

FIG. 6 shows another embodiment of the present invention. This embodiment corresponds to the case of a gate valve which is larger in size as compared with that of the foregoing embodiment. Since axial thrusts acting on a seal valve 36 are great, the slant surface $36b$ of the seal valve 36 and the slant surface $37a$ of a stopper 37 are brought into surface contact, and the slant surface $36c$ of the seal valve 36 and the slant surface $38a$ of a push metal piece 38 are also brought into surface contact, whereupon abrasion is prevented by lowering surface pressures. In this case, the angles of the slant surfaces $36b$ and $36c$ of the seal valve 36 are equalized and are from 55° to 75° C., the contact areas of the stopper 37 and push metal piece 38 are equalized, the materials of the stopper 37 and push metal piece 38 are made the same, and the seal surface $36a$ of the seal valve 36 is pressed against the seal surface $39a$ of an opening 39 while holding parallelism to the latter, thereby to prevent the abrasion and seizure of the contact parts. Also in this case, the same functional effects as in the foregoing case can be achieved.

Although each of the above embodiments has referred to the scanning electron microscope for measuring the minute line width of the wafer, the present invention is well suited also to surface analyzers employing particle beams, such as another ordinary scanning electron microscope, a transmitting electron microscope and an ion microanalyzer, and to vacuum equipment, especially semiconductor production equipment.

As described above, the present invention prevents the abrasion and seizure of a gate valve, lessens the contamination of a sample and makes an analysis of long term possible, thereby to provide a surface analyzer employing a particle beam, which prevents the abrasion and seizure of the gate valve, which lessens the contamination of the sample and which realizes the analysis of long term.

We claim:

1. In a particle beam surface analyzer, comprising a partition wall separating a vacuum space, an opening that is provided in the partition wall through which the particle beam is taken out, a seal member which is moved along a seal surface of the partition wall and seals the opening, a condenser lens which converges the particle beam onto the sample, and detector for detecting a physical quantity generated from the sample when the particle beam is irradiated on the sample, the particle beam surface analyzer characterized by further comprising:
a movable shift member that pushes one side surface of the seal member along the seal surface, an other side surface of the seal member having a predetermined angle to the seal surface greater than 55° and
a stopping member which contacts the other side surface of the seal member so as to exert a force on the other side surface till the seal member reaches the openings, whereby resultant forces between the seal member and the seal surface in the side of the one side surface is equal to that in the side of the other side surface.

2. A particle beam surface analyzer as defined in claim 1, characterized in that:
the predetermined angle of the other side surface is larger than an angle of the one side surface to the seal surface.

3. A particle beam surface analyzer as defined in claim 2, characterized in that:
a friction factor between the movable shift member and the one side surface of the seal member is larger than a friction factor between the stopping member and the other side surface of the seal member.

4. A particle beam surface analyzer as defined in claim 2, characterized in that:
a contact area between the movable shift member and the one side surface of the seal member is larger than a contact area between the stopping member and the other side surface of the seal member.

5. A particle beam surface analyzer as defined in claim 1, characterized in that:
the predetermined angle of the other side surface is from 55° to 75° C..

6. A particle beam surface analyzer as defined in claim 1, characterized in that:
the stopping member has a spherical end portion which is abutted to the other side surface of the seal member.

7. A particle beam surface analyzer as defined in claim 1, characterized in that:
the stopping member has a slant surface portion which is abutted to the other side surface of the seal member.

8. A particle beam surface analyzer as defined in claim 1, characterized in that:
the seal member has a sealing elastic element between the seal member and the seal surface.

9. A particle beam surface analyzer as defined in claim 8, characterized in that:
the sealing elastic element is an O-ring.

10. A particle beam surface analyzer as defined in claim 1, characterized in that:
the predetermined angle of the other side surface is equal to an angle of the one side surface to the seal surface.

11. A particle beam surface analyzer as defined in claim 10, characterized in that:
a friction factor between the movable shift member and the one side surface of the seal member is equal to a friction factor between the stopping member and the other side surface of the seal member.

12. A particle beam surface analyzer as defined in claim 10, characterized in that:
a contact area between the movable shift member and the one side surface of the seal member is equal to a contact area between the stopping member and the other side surface of the seal member.

* * * * *